(12) United States Patent
Schulman

(10) Patent No.: US 6,408,110 B2
(45) Date of Patent: *Jun. 18, 2002

(54) TILED IMAGING APPARATUS PROVIDING SUBSTANTIALLY CONTINUOUS IMAGING

(75) Inventor: Tom Gunnar Schulman, Masala (FI)

(73) Assignee: Simage Oy, Espoo (FI)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/890,936

(22) Filed: Jul. 10, 1997

(30) Foreign Application Priority Data

Jul. 11, 1996 (GB) .............................................. 9614620

(51) Int. Cl.7 .......................... G06K 7/00; H01L 27/14
(52) U.S. Cl. ...................... 382/312; 250/266; 257/777
(58) Field of Search ................................ 382/312, 313, 382/314, 315, 316, 317, 318; 250/266, 232, 394, 365, 364, 370.14, 208.6, 208.1, 208.2; 358/474; 235/444; 257/443, 222, 777

(56) References Cited

U.S. PATENT DOCUMENTS

| 3,939,555 A | 2/1976 | Jantsch et al. ................. 29/577 |
| 4,467,342 A | * 8/1984 | Tower .......................... 357/30 |
| 4,755,681 A | * 7/1988 | Oka et al. ................. 250/37.01 |
| 4,891,522 A | * 1/1990 | Coon et al. .............. 250/370.1 |
| 4,914,302 A | * 4/1990 | Kiri ...................... 250/370.15 |
| 5,065,245 A | 11/1991 | Carnall, Jr. et al. ..... 358/213.11 |
| 5,391,881 A | * 2/1995 | Jench et al. ............. 250/37.09 |
| 5,668,400 A | * 9/1997 | Quinn ........................ 257/618 |

FOREIGN PATENT DOCUMENTS

| EP | 0 262 267 A1 | 4/1988 | .......... H04N/5/335 |
| EP | 0 291 351 A1 | 11/1988 | ............. G01T/1/29 |
| EP | 0 421 869 A1 | 4/1991 | ............. G01T/1/29 |
| JP | 59222731 | * 12/1984 | ............. G01J/5/02 |

OTHER PUBLICATIONS

Patent Abstracts of Japan; Publication No: 59222731; Publication Date: Dec. 14, 1984; Application Date: Jul. 2, 1983, Application No: 58098333; Applicant: Matsushita Electric Ind Co Ltd.; Inventor: Nakamura Kunio; Int. C1. G01J 5/02 G08B 13/18; Title: Infrared–Ray Detecting Device.

* cited by examiner

Primary Examiner—Matthew C. Bella
(74) Attorney, Agent, or Firm—Kenyon & Kenyon

(57) ABSTRACT

An imaging apparatus includes a plurality of imaging device tiles arranged on an imaging support. Each of the imaging device tiles includes an imaging device having an imaging surface and a non-active region, wherein the imaging surface of a first imaging device tile at least partially overlies the non-active region of a second imaging device tile.

39 Claims, 3 Drawing Sheets

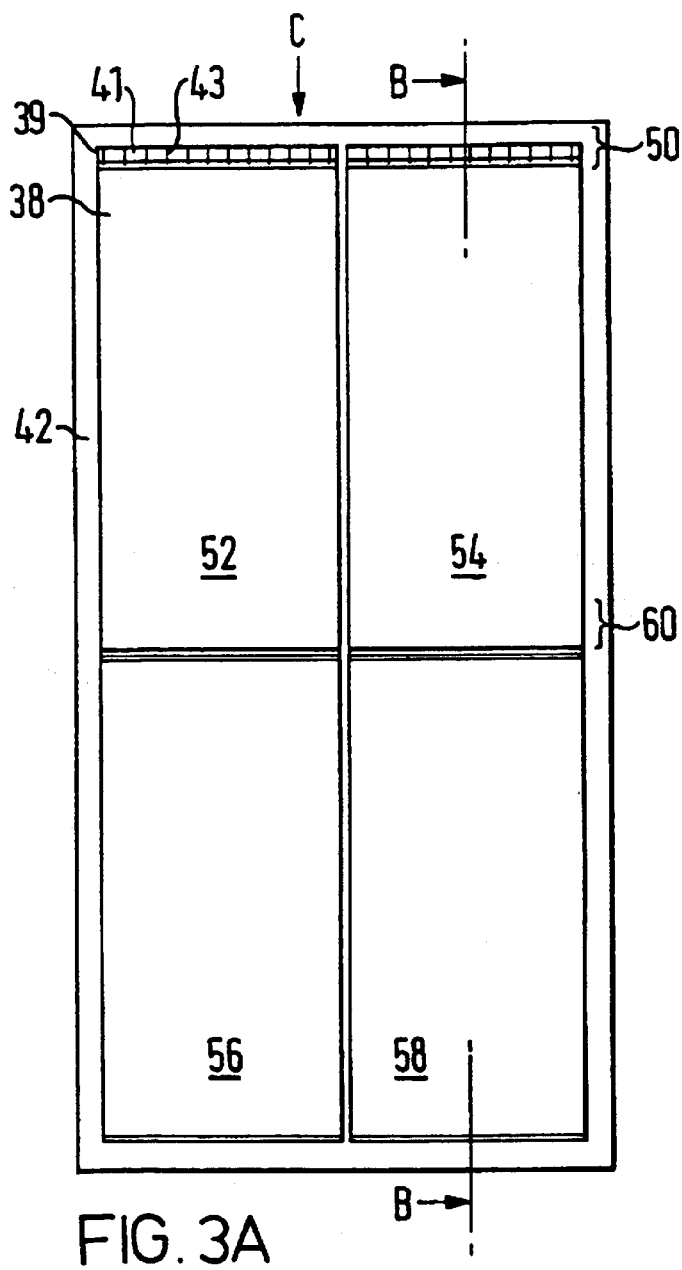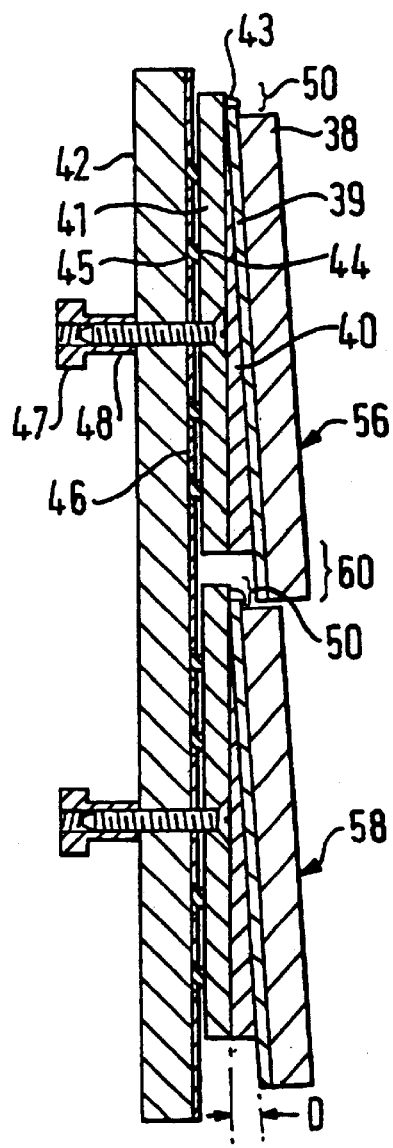
FIG. 3A          FIG. 3B
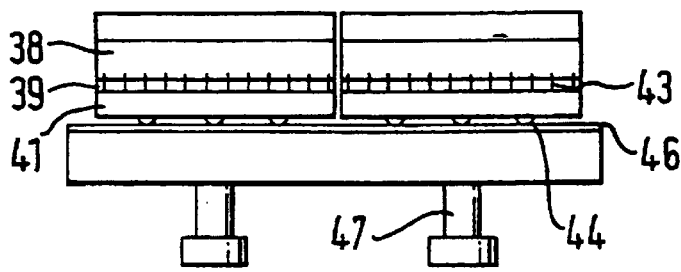
FIG. 3C

TILED IMAGING APPARATUS PROVIDING SUBSTANTIALLY CONTINUOUS IMAGING

BACKGROUND OF THE INVENTION

1. Field of the Invention

The invention relates to the field of imaging, an in particular to apparatus for large area imaging.

2. Description of the Art

Imaging systems are used in a wide range of applications, particularly for imaging for medical diagnosis, in biotechnology, and in industrial applications for non-destructive testing and on-line product quality control. For all of these fields of application, the prevailing means of performing imaging has been to use radiation, usually X-rays, gamma-rays and beta-rays. Radiation is detected by some sort of imaging plane, which need not be planar. Accordingly, the term imaging surface will be used hereinafter. Images are formed either directly on the imaging surfaces (e.g., projection imaging) or data are processed and images are reconstructed in a computer (e.g., computerized tomography or coded aperture imaging in nuclear medicine).

Traditionally, the imaging surface was formed by a film in a cassette. Other imaging surface solutions have been developed over the past 40 years offering digital imaging. Such examples are NaI scintillating screens, NaI scintillating crystals, BGO crystals, wire gas chambers, digital imaging plates etc. More recently, semiconductor imaging solutions such as Charged Coupled Devices (CCDs), Si microstrip detectors and semiconductor pixel detectors have been developed.

Typically, in all of the above cases, when a large imaging area is needed it is made either as a monolithic structure (e.g., films, digital imaging plates, NaI screens, etc.) or as a mosaic of smaller pieces (tiles) put together and fixed on a support surface (e.g., gamma cameras with NaI crystals). When a monolithic large imaging surface is employed, if a part of the surface is defective then the whole surface needs to be changed. Unfortunately, the most precise digital on-line imaging devices proposed so far involve pixel-based semiconductors which cannot be manufactured in large areas (larger than a few square cm at most). Moreover, it would not be desirable to manufacture, for example, a monolithic 30 cm by 30 cm digital imaging semiconductor surface because the yield would be low. If a portion of the expensive imaging area became defective, then the whole surface would have to be replaced.

It has been proposed to provide a large area imaging surface (larger than a few square mm) using a tiling approach. The applicants own patent application WO 95/33332 proposes such an approach. Using such an approach, individual imaging devices are arranged in an array, or mosaic, on an imaging support to form a large area imaging mosaic. Outputs from the individual imaging devices can be processed to provide a single output image corresponding substantially to the whole area covered by the imaging surface. However, when the imaging devices are tiled to form such a mosaic, dead spaces are left around the active imaging areas of the imaging devices. In order to deal with this problem it is proposed to stagger adjacent rows of imaging devices in the array and to provide for relative movement between an object to be imaged and the imaging array. Although such an approach does give good results and means that the effect of the dead spaces can be at least substantially eliminated, this does require the provision of a mechanism for the relative movement and appropriate software for processing the resultant multiexposure image.

There is thus a need for an improved imaging system and method which, while providing the advantages of the tiling approach, remove or at least mitigate the problems of previous tiling approaches.

SUMMARY OF THE INVENTION

According to embodiments of the present invention, an imaging apparatus includes an imaging support and a plurality of imaging device tiles. Each tile includes an imaging device having an imaging surface and has a non-active region at or adjacent an edge of the file. The imaging device on the tile mounted on the support may be tilted, or angled, such that part of the imaging surface of one tile at least partially overlies the non-active region of another tile, thereby providing substantially continuous imaging in a first direction. Such embodiments provide a new imaging mosaic system for producing imaging mosaics using a plurality of imaging devices tiles and an imaging support in a manner which reduces or substantially eliminates the dead spaces between tiles.

According to one particular embodiment, which enables the use of a planar support, each tile includes a mount having a mounting surface for mounting the tile on the support and a device support structure for carrying the imaging device on the mount such that the imaging surface is tilted with respect to the mounting surface. The support structure may be an intermediate member between the imaging device and the mount, and may be wedge-shaped to fully support the imaging device. However, alternatives are possible, for example spacers at one end of the tile.

In an alternate embodiment directed to the use of planar tiles, each tile includes a mount having a mounting surface for mounting the tile on the support. The support provides a plurality of respective tile mounting locations on a support surface, the mounting locations being tilted to provide sawtooth deviations from the support surface. The imaging surface of each imaging device may thus be tilted with respect to the support surface.

The mount in such embodiments may be planar, and may be implemented using, for example, a printed circuit board. The imaging devices may also be planar, and may include, for example, a planar detector layer overlying a planar image readout layer, a surface of the detector layer forming the imaging surface. The detector layer can provide a plurality of detector cells and the readout layer can provide a plurality of corresponding readout circuits, each readout circuit being coupled to a respective detector cell. In a particular embodiment, the detector layer is substantially rectangular, the readout layer is substantially rectangular and has a connection region which extends beyond the detector layer at one end thereof, the mount is substantially rectangular and has a connection region which extends beyond the readout layer at the one end, wired connections are provided between the connection regions of the readout layer and the mount, and the non-active region of the tile comprises the connection regions of the readout layer and the mount. The tile may be elongated in the first direction (i.e., the direction of substantially continuous imaging) to minimize the angle of tilt and any effects of parallax. Moreover, the tiles may be mounted on the support such that the detector layers of adjacent tiles extend in a second direction perpendicular to the first direction so as to almost or actually touch each other.

The imaging devices may be positioned and held on the support in a reversible and non-destructive manner. For example, an arrangement for mounting the imaging devices may allow individual imaging devices to be removed multiple times so that the same imaging device can be used in a different imaging support or it can be replaced if found to be defective without damaging the imaging support and without affecting the operation of any other imaging device on the imaging support. The support may provide a plurality of tile mounting locations, with the mounting arrangement removably mounting a respective tile at each location.

According to another particular embodiment, each tile mounting location may include a plurality of support contacts, each for co-operating with a respective tile contact for a transfer of signals between the support and the tile. The support contacts may be recesses for receiving correspondingly shaped bumps on a tile, or bumps for receiving correspondingly shaped recesses on a tile. The support contacts may also be resilient conductive members overlying contact pads.

In yet another embodiment, the imaging apparatus may include a separate insulating substrate, which is located between the imaging device tile(s) and the imaging support and is aligned to enable electrical contact between each support contact and a corresponding tile contact via a respective resilient contact member. In this embodiment, each resilient conductive member is a ring having a hole for aligning bumps of the tile contacts or of the support contacts with corresponding contacts of the support, or corresponding contacts of the tile, respectively. The resilient conductive members may be conductive rubber, conductive polymers or metal springs.

The mounting arrangement may be adapted to apply an adjustable mounting force for removable mounting a tile at a tile mounting location. The mounting arrangement may include a hole for each file mounting location, the hole being of appropriate diameter to accommodate securing member protruding from the tile. A fastener for engaging with the securing member can be provided for each hole on the support at each tile mounting location. In a particular embodiment, the fastener is a nut and the securing member is a screw, the nut being adapted to be tightened on the screw after the imaging device tile has been positioned on the tile mounting location with the screw extending through the hole, whereby the nut is used to secure the tile at the tile mounting location with an adjustable mounting force. Alternatively, the mounting arrangement may include a screw located or locatable at each imaging device tile location, for engaging with a threaded hole in a mount of an imaging device tile.

According to another embodiment, the imaging apparatus may include a plurality of different imaging supports and a common set of imaging device tiles which are mountable on a selected imaging support at any one time, but are removable, whereby they may be mounted on another one of the imaging supports. An imaging support for apparatus such as those described above may provide a plurality of respective tile mounting locations on a support surface, the mounting locations being tilted to provide sawtooth deviations from the support surface. The support may include an arrangement for mounting an imaging device tile at each mounting location in a non-destructive, removable manner. The support enables the use of a planar imaging device tile.

An imaging device tile for imaging apparatus such as those described above may include an imaging device having an imaging surface, a non-active region at or adjacent an edge of the tile, a mount having a mounting surface for mounting the tile on an imaging support and a structure for supporting the imaging device on the mount such that the imaging surface is at an angle to the mounting surface. This form of imaging device tile enables the use of a support which does not have sawtooth deviations for the tile mounting locations.

BRIEF DESCRIPTION OF THE DRAWINGS

FIG. 3A is a schematic plan view of an arrangement of four imaging devices mounted on an imaging support according to an embodiment of the present invention.

FIG. 3B is a cross-sectional view of the arrangement of FIG. 3A along line B—B.

FIG. 3C is an end view of the arrangement in FIG. 3A in the direction of arrow C in FIG. 3A.

DETAILED DESCRIPTION

Before describing a particular embodiment of the invention, examples of possible approaches to removable mounting of imaging devices will be described. The removable mounting of imaging devices forms the subject-matter of Appendix A.

According to one particular embodiment of the present invention, by way of example only, the imaging devices may be Active Semiconductor Imaging Devices (ASIDs) as described in Appendix B. An ASID is an active, dynamic semiconductor pixel imaging device with dimensions from, possibly, a few square mm to several square cm.

Figure 1A:
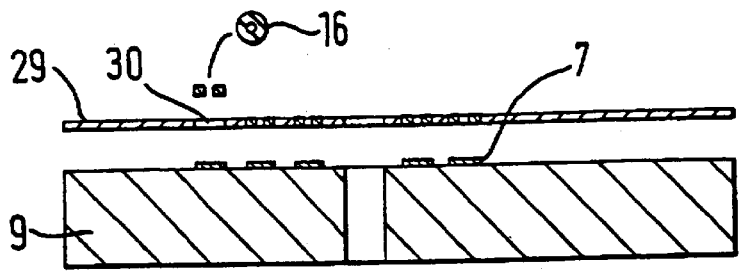
FIG. 1A is a schematic cross-sectional view of part of an imaging support according to an embodiment of the present invention.
Figure 1B:
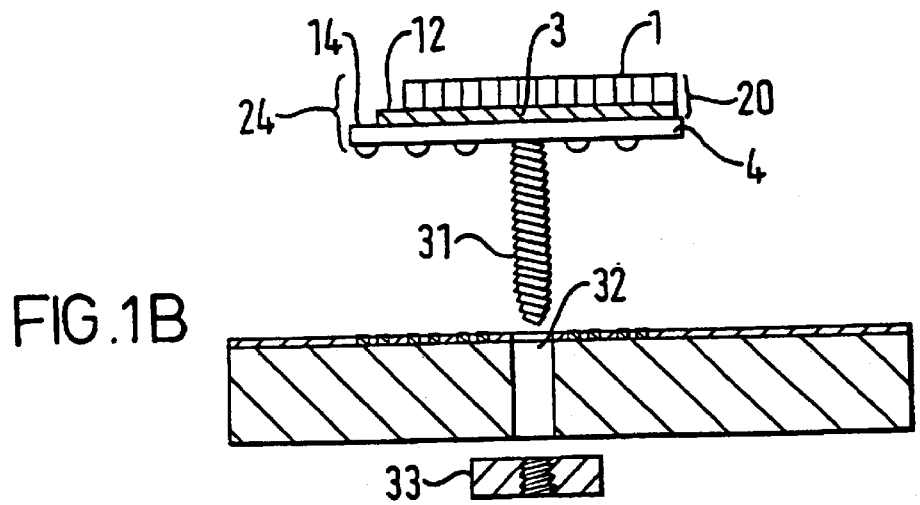
FIG. 1B is a schematic cross-sectional view of the part of the imaging support of FIG. 1A with one example of an imaging device having a mount.
Figure 1C:
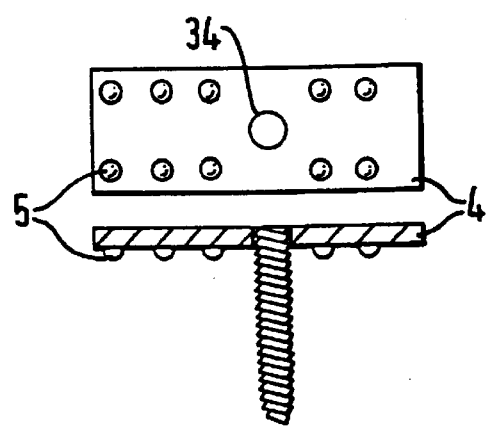
FIG. 1C is a schematic view of the underside and a part cross-sectional view of the side of the imaging device mount for the imaging device of FIG. 1B.
Figure 1D:
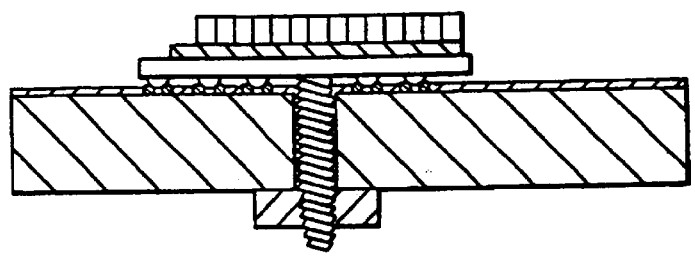
FIG. 1D is a schematic cross-section view of a part of the imaging support of FIG. 1B with the imaging device of FIG. 1B mounted thereon.
Figure 2A:
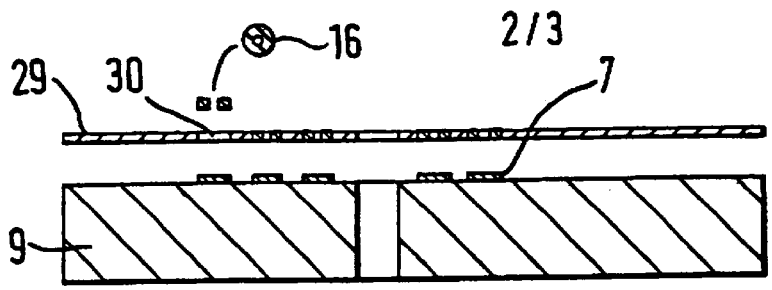
FIGS. 2A–2D are views corresponding to those of FIG. 1 for a second example of an imaging device mount.
Figure 2B:
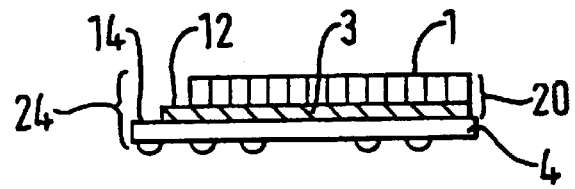
Figure 2B:
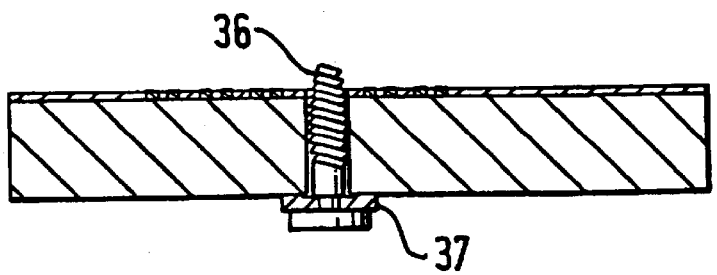
Figure 2C:
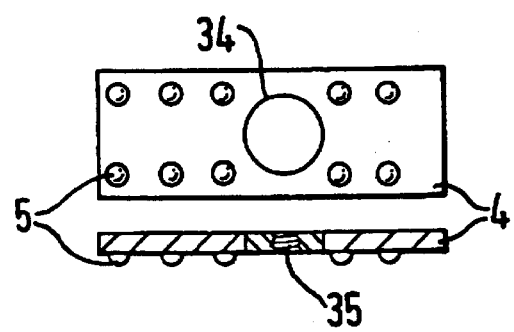
Figure 2D:
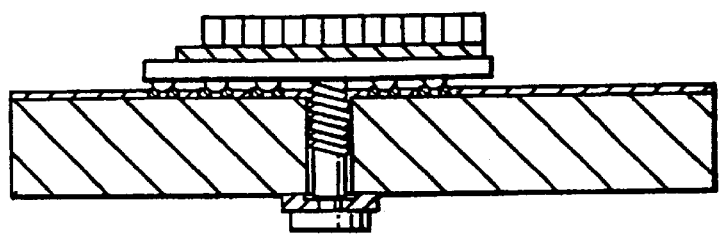

A cross-section of one such imaging device tile 24 is shown schematically in FIG. 1B over a tile mounting location on a circuit board 9 of an imaging support. FIG. 1A is a schematic cross-section illustrating the application of an insulating layer 29 and conductive rubber rings 16 over the circuit board 9. FIG. 1C provides a view of the underside and a cross-section view of an imaging device mount (e.g., a printed circuit board or PCB) 5. FIG. 1D is a cross-sectional view of an imaging device tile 24 secured at a tile mounting location by engagement of a nut 33 over a screw 31 of the imaging device file 24 (shown disengaged in FIG. 1B).

The surface area of the imaging device 20 can vary depending on the application and the semiconductor materials chosen. Typical sizes are of the order of one square millimeter to several square centimeters, although the present invention is not limited to imaging devices of any particular size. Radiation enters a semiconductor detector layer 1 from an imaging surface (the top face in FIG. 1B) and upon absorption creates an electric charge. On the exit face of the detector layer 1, electrode pads (not shown) define detector cells or pixels. Charge created from successive radiation hits is accumulated on the corresponding pixel circuits in a readout layer 3 which are connected to the detector pixels via conductive microbumps 2 (e.g. indium bumps—not shown). The pixel circuits are formed on a semiconductor readout chip which forms the readout layer 3. The imaging device 20, formed by the detector layer 1 and the readout layer 3, is mounted on a mount 4, for example a printed circuit board. The imaging device tile 24 is formed by the combination of the imaging device 20 and the mount 4.

Each imaging device 20 may have tens of thousands of pixels, but only needs approximately 5–15 external lines that will provide control signals, supply voltage and will readout the signal. These lines are provided on the mount 4 and also on a circuit board 9 of an imaging support on which the imaging device tile 24 is mounted. The imaging device file 24 itself carries a number of tile contacts 5 in the form of, for example, small metal spheres or bumps. The number of contacts typically corresponds to the number of external lines. The tile contacts 5 match an equal number of appropriately-sized support contacts 7 on the circuit board 9 of the imaging support. The contacts on the circuit board 9 of the imaging support are connected to the aforementioned control, supply and signal lines (not shown). In the present example, an intermediate insulating layer 29 is provided between the imaging device mount 4 and the circuit board 9 of the imaging support. Holes 30 are provided in the insulating layer 29 at positions corresponding to the tile contacts and the support contacts 7. Conductive rubber rings 16 are located in the holes 30 in the insulating layer 29.

Good electrical connection between each tile contact 5 on the imaging device mount 4 and the corresponding support contact 7 on the circuit board 9 may be ensured by separate conductive rubber rings 16. These are placed in appropriate holes of the insulating layer 29, which is aligned and glued on top of the circuit board 9. The use of conductive rubber rings (i.e. with holes) is not essential, and conductive flexible pads may be used instead. However, the use of a ring structure with a central hole may be advantageous for aiding alignment of the imaging device. Alternatives to the conductive rubber rings 16, such as conductive polymers or metal springs, may also be used. A screw 31 may be glued into a hole 34 in the imaging device mount 4. This screw is pushed through the hole 32 in the circuit board 9 of the imaging support and is secured by the nut 33. The nut is tightened to press the tile contacts 5 of the imaging device mount 4 against the rubber rings 16, which in turn are pressed against the support contacts 7 of the imaging support circuit board 9, ensuring good electrical contact.

The embodiment illustrated in FIGS. 1A–1D is particularly suitable for providing an imaging area having a plurality of easily removable semiconductor pixel imaging devices as described in the assignee's published International patent application WO 95/33332, or other types of pixel semiconductor imaging devices. If a particular example, such as mammography, is considered, an imaging surface of 30 cm by 30 cm (about 600 imaging devices of the type described in imaging devices will be mounted on a printed circuit board 9 of the imaging support.

Since individual imaging devices may be removed and re-positioned any number of times, the same imaging devices can be used in a number of applications. For example, imaging devices used for mammography can be quickly transferred on a different imaging support for chest X-rays. A variety of imaging supports can have different sizes and shapes but only one set of imaging devices is needed. Additionally, replacing an imaging device can be done by a non-expert and maintenance costs are minimized. Accordingly, contrary to prior approaches where large imaging areas have monolithic imaging means or a fixed tiled imaging plane, embodiments of the present invention provide a new large area imaging system where the imaging mosaic is made of removable imaging devices allowing for multipurpose use and re-use of the individual imaging devices, while also allowing cost effective maintenance of the imaging areas.

By means of the screws and nuts it is also possible individually to adjust the mounting force for each imaging device to ensure good alignment and good electrical contact using flexible contact elements such as the conductive rubber rings. Alternatives to the specific example of the nuts and screws are possible while still retaining the advantages of this mounting approach. For example, wing nuts can be used to aid tightening and subsequent release of nuts. Also, the nuts could be provided with an elongate form on the screws, and the holes in the support plane could be in the form of slits, so that the elongate nuts could be inserted through the slots and then tightened so that the elongate nut engages with the rear surface of the support plane. By suitably configuring the dimensions of the nut and the slot, a desirable range of rotary adjustment may be provided. As a further alternative, a rotatably mounted pin may be provided on the rear of the mount for the imaging device, which pin is provided with at least two perpendicular projections to be passed through an equivalently shaped key hold in the support plane, the pin then being turned after insertion through the keyhole so that the projections engage behind support plane to secure the imaging device.

Another example of an approach to the reversible and non-destructive mounting of imaging devices using screws is illustrated in FIGS. 2A–2D. The four schematic views 2A, 2B, 2C and 2D correspond generally to those of FIGS. 1A–1D, except that in this case the mount 4 of the imaging device is provided with a threaded hole 35 into which a screw 36, which is rotatably mounted at an imaging device location on the support plane 9, could be engaged to secure the imaging device to the support plane. The screw 36 could be inserted through a hole 32 in the support plane 9 at the imaging device location when it is desired to attach an imaging device at the location.

Alternatively, and as shown in FIGS. 2A–2D, the imaging device could be permanently mounted, in a rotatable manner, at the imaging device location. For example a neck on the screw could be mounted in a collar 37, which collar is then attached over the hole 32 in the support plane at an imaging device location so that the screw 36 is rotatably mounted at that location. In this example, the imaging device support will have an array of upstanding screws 36 to which the imaging devices with threaded holes can be attached. This example provides advantages as regards ease of use. As an alternative to a screw 36 and threaded hole 35 in this embodiment, other similar arrangements, for example a stud with bayonet pins rotatably mounted in the support plane 9 and cooperating hole with bayonet pin receiving structures on the mount 4 could be provided.

Now that examples of techniques for the non-destructive mounting of imaging devices has been described, the use of such techniques in an embodiment of the invention will be described. It will be noted in FIGS. 1B and 2B, that there are two steps at the left hand end of the imaging device. The first step 12 is between the detector layer 1 and the readout layer 3, and the second step 14 is between the readout layer 3 and the mount 4. The purpose of these steps is to enable the connection of bond wires (not shown) between contact pads on the readout chip and respective contact pads on the mount 4. This provides for the external electrical interface of the readout chip to the tile contacts 5 mentioned previously. In the readout chip, all internal electrical connections are brought to a single end of the chip to facilitate this connection and also to reduce the amount of dead imaging area for a mosaic of imaging device tiles. It will be appreciated that when the imaging devices tiles are arranged side-by-side and end-to-end, dead spaces (i.e., areas over which the detector does not extend) occur at the stepped region described above. Also, in conventional tiled arrays, spaces between adjacent imaging devices arranged side-by-side occur as the supports are wider than the detector surfaces. Approaches to dealing with this problem have been proposed which involve staggering adjacent rows of imaging devices on an imaging array and then providing for relative movement between an object to be imaged and the imaging array. This means that the effect of the dead spaces can be at least substantially eliminated, but this does require the provision of a mechanism for the relative movement and appropriate software for processing the resultant multi-exposure image. Embodiments of the present invention provide a mechanism which can mitigate or completely eliminate the disadvantages of such prior approaches.

Part of another embodiment of the present invention is illustrated schematically in FIGS. 3A–3C. In this embodiment the structure of the individual tiles is modified to enable adjacent tiles to be mounted very close to or even touching each other. The tiles can be connected both electrically and mechanically to the support plane in, for example, one of the ways described above, although other suitable mounting techniques could be employed.

In the particular embodiment shown in FIGS. 3A–3C, electrical connection between an imaging device mount (e.g., tile PCB) 41 and a support plane 42 is achieved by the contact between conductive (e.g., metal) balls 44 on the imaging device mount 41 and conductive rings 45 (e.g., of rubber), placed in appropriate holes in an electrically insulating intermediate plane 46, which is aligned and glued on top of the support plane 42 so that the rings 45 overlie contact pads (e.g., of metal) on the support plane 42. Mechanical connection is assured by means of a screw 48, which is glued into a hole in the imaging device mount 41. This screw is pushed through a hole in the support plane and secured by a nut 47. The nut 47 is tightened to press the conductive balls 44 of the imaging device mount 41 against the rings 45 which in turn are pressed against the metal pads of the support plane ensuring good electrical contact.

In this embodiment, the signal detecting element (i.e., the detector 38 and the readout chip 39) is tilted, or angled, by applying a support structure 40 of triangular or wedge shape between the imaging device mount 41 and the readout chip 39. One edge of the detector 38 and the readout chip 39 can then be extended to cover the wire bond pads and the bond wires 43 of the neighbouring imaging tile. The wire bond pads are provided on the imaging device mount 41 for the attachment of bond wires 43, which enable the pixel circuits on the readout chip 39 to be electrically connected to the imaging device mount 41. In this way the dead space which would otherwise be present between the imaging tiles when mounted on the support plane 42 is minimized or even completely eliminated. The elimination of this dead space means that alternative techniques to provide complete image coverage (for example, moving the support plane 42 and taking multiple exposures) are not required.

In this embodiment a rectangular shape of individual imaging tiles with one elongated side (preferably as long as possible) is chosen to minimize any parallax error which may be caused by the tilting (i.e., minimize the tilting angle). For example, the dimensions of the detector 38 and the readout chip 39 can be 18 mm by 10 mm, but many other dimensions are possible depending on the processing of the readout chip 39 and the detector 38. FIG. 3A shows a planar view of the tile arrangement (four tiles in this example, although there will typically be many more tiles in an array). FIG. 3B is a cross-sectional view at B—B. FIG. 3C is an end view in the direction of the arrow C.

In FIG. 3A, the bonding wires 43 and the stepped uppermost end 50 of the uppermost imaging device tiles 52, 54 (as viewed in FIG. 3A) can be seen. However, the bonding wires 43 and the stepped uppermost end 50 of the lowermost imaging device tiles 56, 58 (as viewed in FIG. 3A) cannot be seen as these are covered by the lowermost end 60 of the uppermost imaging device tiles 52, 54 when viewed from above (i.e., looking down on the plane of FIG. 3A). This is a result of the tilting of the signal detecting elements comprising the detector 38 and the readout chip 39 as can be seen in the cross-sectional view of FIG. 3B. In the particular example shown in FIGS. 3A–3C, where the detector 38 and the readout chip 39 are approximately 18 mm by 10 mm, and the tilt provides a difference in the "height" (i.e., the horizontal distance D as viewed in FIG. 3B) of the imaging device over the support board between the ends of the imaging device of about 1 mm, the angle of tilt of the imaging device and the imaging surface is about 3°.

The space between tiles in the direction orthogonal to the tilting direction (which corresponds to the section line B—B) may be minimized by ensuring that the width of the imaging surface of the detector 38 (i.e., in the horizontal direction as viewed in FIG. 3A) is the same as or greater than that of the readout chip 39 and the imaging device mount 41. In this manner, the tiles can be mounted so that the detectors actually touch or are separated by a very small amount in that direction.

With an embodiment of this type, the dead space introduced by the bonding pads, bonding wires and readout buffers (e.g., decoders, multiplexers, etc.) on the readout chip 39 and the dead space introduced by the imaging device mount 41 is eliminated because there is overlap of the total dead region with the detecting element 38 of the adjacent file. Also, there is minimal or no dead space at all between tiles in the other direction since tiles are configured to be substantially proximate to or to touch each other and the detector elements 38 may indeed be configured to be precisely equal or extend slightly beyond the dimensions of the readout chip 39.

While in FIGS. 3A–3C an arrangement of four tiles is shown it can be appreciated that any number of tiles can be arranged to provide an imaging area with any practically useful size, for example 45cm by 40cm. Also, although in the above described embodiments reference is made to a support plane, this need not in fact be planar, but could be curved or shaped to fit form a desired imaging plane. For example the imaging support could be shaped as part or the whole of a ring for certain applications.

The contacts on the imaging support may be connected in turn to control electronics and output electronics (not shown) for the imaging array. The output electronics may include one or more analog to digital converters for converting analog signals from the imaging devices into digital signals for processing and displaying image data. An example of suitable control and output electronics and an image processor is described in the assignee's published International patent application WO 95/33332. This International patent application also describes examples of semiconductor pixel imaging devices suitable for use with the present invention. Thus the signal detecting elements referred to above can, for example, be an imaging device which provides an array of imaging cells (or pixels), each including a radiation detector cell and corresponding charge storage for storing charge directly resulting from radiation incident on the radiation detector cell, the charge storage of respective imaging cells being individually addressable for charge readout and/or resetting. However, it should be noted that imaging devices other than semiconductor pixel devices may be used, such as removable CCDs, NaI crystals or small scale wire gas chambers.

Embodiments of the present invention thus provide a stationary tiled imaging area with minimum or indeed no dead space at all. Such embodiments provide tilting of the tiles in the direction of maximum dead space and allowing for overlap between the detecting element of one tile and the dead area of an adjacent tile. In the other orthogonal direction, tiles are arranged as proximate to each other as possible or even touching each other. All tiles are individually removable as previously described, thus offering an ideal digital imaging plane that can be maintained in parts without compromising performance.

Although in the embodiment of FIGS. 3A–3C, a wedge-shaped support structure is shown between a planar detecting element and a planar PCB mount, it will be appreciated that alternative constructions may be employed to provide an angled arrangement of the imaging surface of the detecting element. For example, blocks along one edge, rather than a wedge-shaped structure, may be used. Also, the imaging device or the mount may be wedge shaped, or provided with integral supports at one edge for an angled mounting. Alternatively, the mounting locations of the imaging support could be angled (tilted), or wedge-shaped, at each mounting location for the imaging devices to provide the angled and overlapping mounting of those devices.

Using an embodiment of the invention, for example with the mounting techniques described above, it is possible to configure a variety of clinical equipment with the imaging supports ready and mounted on the corresponding systems awaiting the imaging devices. Imaging devices can be properly packaged and supplied separately from the rest of the imaging system and any average technical employee can handle them and relocate them from one plane to another. In this way, the use of the relatively expensive pixel semiconductor imaging devices is optimized by requiring less imaging devices than are needed simultaneously to equip all systems. In addition, maintenance becomes cost effective. A defective imaging device can be substituted rather than the whole imaging surface (mosaic) and this can be done easily by an average technical employee.

The removable securing can be achieved in a non-destructive way such that an imaging devices may be secured to and removed from an imaging support a plurality of times leaving the imaging device, the board(s) and corresponding contacts in substantially the same state. An arrangement for mounting imaging devices in a removable manner may be implemented using any of a wide variety of techniques, including:

reduced air pressure or vacuum, whereby the imaging devices are effectively "sucked" into position;

screws glued to the PCBs or other mounting means of the imaging devices and then pushed through corresponding holes in the support plane (e.g., the circuit board of the imaging support), the screws being then secured by nuts on the opposite side of the support plane;

a socket configuration (e.g., zero-insertion force socket means) whereby the imaging devices have pins that plug into corresponding sockets on the support plane;

clips, whereby the imaging devices are kept in position with mechanical clips, strings or the like;

magnets, whereby small magnets, either on the imaging support or on the imaging devices, or both, secure the imaging devices to the imaging plane; and other mechanical arrangements.

Embodiments of the present invention may be used for any radiation type in any radiation imaging field where areas larger than a few square mm are needed. In particular, such embodiments find application in medical diagnosis imaging with X-rays and gamma-rays, in biotechnology imaging with beta-rays (where isotopes are used as labels on the samples to be image) and in industrial applications for non-destructive testing and product quality control.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

For example, in the embodiment described with reference to FIGS. 3A–3C, the tiles are tilted with respect to one axis (one direction) with adjacent rows of tiles being arranged so that the detector areas substantially touch each other. However, in an alternative embodiment, it is possible for the tiles to be tilted with respect to two axes (i.e., about two orthogonal directions, each parallel a respective side of a square tile or about a single axis which passes through two opposite corners of a tile) so that dead regions along two adjacent edges of one tile may be covered by the detector imaging surface of two adjacent files which meet at the corner between those adjacent edges. In order to visualise this embodiment, it is helpful to think of the tiles being arranged like the scales of a fish or in diamond shapes rather than as a rectangular array of rows and columns of tiles. In other words, for any one tile, two edges which have dead spaces either side of a first corner will be lower than the two opposite edges either side of the opposite corner. Thus the dead spaces of the two lower edges of the tile in question will be covered by the detector imaging surface at the higher edges of two respective adjacent tiles. Also, the opposite, higher edges of detector imaging surfaces of the tile in question will overlie part of the dead space at the edges of two further adjacent tiles. For such an alternative embodiment, it is advantageous for the tiles to be substantially square as opposed to being elongated rectangles. This embodiment if useful for imaging devices having bond wire connections or other dead spaces along two edges, rather than along a single edge as in the preferred embodiment of FIG. 3.

What is claimed is:

1. An imaging apparatus comprising a plurality of imaging device tiles arranged on an imaging support, each of said imaging device tiles including an imaging device comprising a plurality of pixels and having an imaging surface and a non-active region, wherein the imaging device of a first imaging device tile at least partially overlies the non-active region of a second imaging device tile without overlying the imaging surface of the imaging device of said second imaging device file, each tile further comprising a mount having a mounting surface for mounting a file on said imaging support.

2. The imaging apparatus of claim 1, wherein said non-active region is proximate to an edge of said imaging device tile.

3. The imaging apparatus of claim 1, wherein said first imaging device tile is tilted with respect to said imaging support when mounted thereon.

4. The imaging apparatus of claim 1, wherein each of said imaging device tiles further includes an imaging device support structure.

5. The imaging apparatus of claim 4, wherein said imaging device support structure is arranged between said imaging device and said mount.

6. The imaging apparatus of claim 5, wherein said imaging device support structure is wedge-shaped.

7. The imaging apparatus of claim 1, wherein said imaging support includes a support surface with a plurality of tile mounting locations corresponding to said plurality of imaging device tiles, said tile mounting locations being tilted to provide sawtooth deviations from said support surface.

8. The imaging apparatus of claim 4, wherein said mount is planar.

9. The imaging apparatus of claim 1, wherein said imaging device is planar.

10. The imaging apparatus of claim 1, wherein said imaging device includes a planar detector layer overlying a planar image readout layer, said detector layer having a surface forming said imaging surface.

11. The imaging apparatus of claim 10, wherein said detector layer comprises a plurality of detector cells and said image readout layer comprises a plurality of readout circuits, each of said readout circuits being coupled to a corresponding one of said detector cells.

12. The imaging apparatus of claim 11, further comprising a substantially rectangular mount, wherein said detector layer is substantially rectangular, said image readout layer is substantially rectangular and further comprises a connection region extending beyond said detector layer at an end thereof, said mount has a connection region extending beyond said image readout layer at an end thereof, and wired connections are provided between said connection regions of said image readout layer and said mount, said non-active region of said imaging device tile comprising said connection regions of said image readout layer and said mount.

13. The imaging apparatus of claim 10, wherein said imaging apparatus provides substantially continuous imaging in a first direction, said imaging device tiles being mounted on said imaging support such that said detector layers of adjacent imaging device tiles extend in a second direction perpendicular to said first direction, said detector layers of adjacent imaging device tiles being in close proximity to one another.

14. The imaging apparatus of claim 13, wherein said detector layers of adjacent imaging device tiles are in physical contact with one another.

15. The imaging apparatus of claim 1, further comprising an arrangement for mounting said imaging device tiles on said imaging support in a non-destructive, removable manner.

16. The imaging apparatus of claim 15, further comprising a plurality of mounting locations, wherein said arrangement for mounting said imaging device tiles removably mounts an imaging device tile at each of said mounting locations.

17. The imaging apparatus of claim 16, wherein each of said plurality of mounting locations comprises a plurality of support contacts, said support contacts being arranged to cooperate with respective tile contacts on said imaging device tiles.

18. The imaging apparatus of claim 17, wherein said support contacts are shaped to cooperate with said tile contacts.

19. The imaging apparatus of claim 18, wherein each of said support contacts comprises a recess and each of said tile contacts comprises a correspondingly shaped bump.

20. The imaging apparatus of claim 18, wherein each of said support contacts comprises a bump and each of said tile contacts comprises a correspondingly shaped recess.

21. The imaging apparatus of claim 18, wherein each of said support contacts comprises a resilient conductive member overlying a contact pad.

22. The imaging apparatus of claim 21, further comprising a separate insulating substrate arranged between said imaging device tiles and said imaging support, wherein said resilient conductive members are arranged in holes in said separate insulating substrate, said separate insulating substrate being aligned to enable electrical contact between each of said support contacts and said tile contacts through respective resilient conductive members.

23. The imaging apparatus of claim 21, wherein each of said resilient conductive members comprises a ring having a hole configured to align said support contacts with said tile contacts.

24. The imaging apparatus of claim 23, wherein said support contacts comprise bumps.

25. The imaging apparatus of claim 23, wherein said tile contacts comprise bumps.

26. The imaging apparatus of claim 21, wherein each of said resilient conductive members is selected from a group consisting of conductive rubber, conductive polymer, and metal spring.

27. The imaging apparatus of claim 15, wherein said arrangement for mounting said imaging device tiles is adapted to apply an adjustable mounting force for removably mounting an imaging device tile at a tile mounting location.

28. The imaging apparatus of claim 27, wherein said arrangement for mounting said imaging device tiles comprises a plurality of holes corresponding to each of a plurality of tile mounting locations, each of said holes having a diameter sufficient to accommodate a securing member protruding from an imaging device tile.

29. The imaging apparatus of claim 28, wherein each of said plurality of holes further comprises a fastener.

30. The imaging apparatus of claim 29, wherein said securing member comprises a screw and said fastener comprises a nut.

31. The imaging apparatus of claim 30, wherein said nut is adapted to be tightened on said screw after said imaging device tile is positioned at said tile mounting location with said screw extending through said hole.

32. The imaging apparatus of claim 15, wherein an imaging device tile includes a mount with a threaded hole, said arrangement for mounting said imaging device tiles comprising a tile mounting location having a screw for engaging said threaded hole.

33. The imaging apparatus of claim 1, further comprising a plurality of imaging supports, wherein each of said imaging device tiles is removably mountable on any of said plurality of imaging supports.

34. An imaging support for an imaging apparatus, said imaging apparatus having a plurality of imaging device tiles arranged on said imaging support, wherein each of said imaging device tiles includes an imaging device comprising a plurality of pixels and having an imaging surface on a non-active region, the imaging device of a first imaging device tile at least partially overlying the non-active region of a second imaging device tile without overlying the imaging surface of the imaging device of said second imaging device tile, said imaging support comprising a support surface with a plurality of tile mounting locations corresponding to said plurality of the imaging device tiles, and further comprising an arrangement for mounting said imaging device tiles at said tile mounting locations in a non-destructive, removable manner, said tile mounting locations being tilted to provide sawtooth deviations from said support surface.

35. The imaging support of claim 34, further comprising an arrangement for mounting said imaging device tiles at said tile mounting locations in a non-destructive, removable manner.

36. An imaging apparatus comprising a plurality of imaging device tiles arranged on an imaging support, each of said imaging device tiles including an imaging device comprising a plurality of pixels and having an imaging surface and a non-active region proximate an edge of said tile, said imaging device on said imaging device tile being mounted on said imaging support in a tilted orientation, wherein the imaging device of a first imaging device tile at least partially overlies the non-active region of a second imaging device tile without overlying the imaging surface of the imaging device of said second imaging device tile, each tile further comprising a mount having a mounting surface for mounting a tile on said imaging support.

37. An imaging apparatus comprising a plurality of imaging device tiles arranged on an imaging support, each of said imaging device tiles including an imaging device, said imaging device comprising a plurality of pixels and having an imaging surface and a non-active region, the imaging device of a first imaging device tile at least partially overlying the non-active region of a second imaging device tile without overlying the imaging surface of the imaging device of said second imaging device tile, each tile further comprising a mount having a mounting surface for mounting a tile on said imaging support, there being provided a device support structure arranged between said imaging device and said mounting surface to tilt said imaging device with respect to said mounting surface.

38. An imaging support for an imaging apparatus, said imaging apparatus having a plurality of imaging device tiles arranged on said imaging support, each of said imaging device tiles including an imaging device, said imaging device comprising a plurality of pixels and having an imaging surface and a non-active region, the imaging device of a first imaging device tile at least partially overlying the non-active region of a second imaging device tile without overlying the imaging surface of the imaging device of said second imaging device tile, said imaging support comprising a support surface with a plurality of tile mounting locations corresponding to said plurality of imaging device tiles, and further comprising an arrangement for mounting said imaging device tiles at said tile mounting locations in a non-destructive, removable manner, said tile mounting locations being tilted to provide sawtooth deviations from said support surface.

39. An imaging apparatus comprising a plurality of imaging device tiles arranged on an imaging support, each of said imaging device tiles including an imaging device, said imaging device comprising a plurality of pixels and having an imaging surface and a non-active region proximate at an edge of said tile, said imaging device on said imaging device tile being mounted on said imaging support in a tilted orientation, the imaging device of a first imaging device tile at least partially overlying the non-active region of a second imaging device tile without overlying the imaging surface of the imaging device of said second imaging device tile, each tile further comprising a mount having a mounting surface for mounting a tile on said imaging support, and an imaging device support structure arranged between said imaging device and said mount for providing said tilted orientation.

* * * * *